United States Patent
Suzuki

(10) Patent No.: US 8,797,089 B2
(45) Date of Patent: Aug. 5, 2014

(54) VOLTAGE GENERATOR

(75) Inventor: Yoshinao Suzuki, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 149 days.

(21) Appl. No.: 13/603,800

(22) Filed: Sep. 5, 2012

(65) Prior Publication Data

US 2013/0193944 A1 Aug. 1, 2013

(30) Foreign Application Priority Data

Jan. 30, 2012 (JP) ................................ 2012-016707

(51) Int. Cl.
*G05F 1/10* (2006.01)

(52) U.S. Cl.
USPC ........................................................ 327/536

(58) Field of Classification Search
USPC .......... 327/535–539, 543; 323/280, 282, 284, 323/298; 365/185.23
See application file for complete search history.

(56) References Cited

U.S. PATENT DOCUMENTS

| | | | |
|---|---|---|---|
| 6,404,274 B1 | 6/2002 | Hosono et al. | |
| 6,486,729 B2 | 11/2002 | Imamiya | |
| 7,427,890 B2 * | 9/2008 | Chan | 327/536 |
| 7,542,361 B2 | 6/2009 | Sato | |
| 7,595,684 B2 * | 9/2009 | Maejima | 327/538 |
| 7,602,167 B2 * | 10/2009 | Trafton et al. | 323/284 |
| 2005/0046405 A1 * | 3/2005 | Trafton et al. | 323/308 |
| 2005/0212587 A1 * | 9/2005 | Meek et al. | 327/536 |
| 2006/0132222 A1 * | 6/2006 | Meek et al. | 327/536 |
| 2010/0207929 A1 | 8/2010 | Miyazaki | |
| 2011/0069563 A1 * | 3/2011 | Castaldo et al. | 365/189.11 |

FOREIGN PATENT DOCUMENTS

| | | |
|---|---|---|
| JP | 2002-51538 | 2/2002 |
| JP | 2007-80478 | 3/2007 |
| JP | 2010-183710 | 8/2010 |

* cited by examiner

*Primary Examiner* — Adolf Berhane
(74) *Attorney, Agent, or Firm* — Oblon, Spivak, McClelland, Maier & Neustadt, L.L.P.

(57) ABSTRACT

According to one embodiment, a voltage generator includes a step-up circuit and a limiter circuit. The step-up circuit outputs a first voltage to a first node. The limiter circuit includes first and second resistive elements, first and second capacitive elements, a switch element, and a comparator. The first resistive element is between the first node and a second node. The second resistive element is connected to the second node. The first capacitive element is between the first and second nodes. The switch element connects the second capacitive element to the second node at the same time that the first node is connected to a load. The comparator compares the potential at the second node with a reference potential.

16 Claims, 11 Drawing Sheets

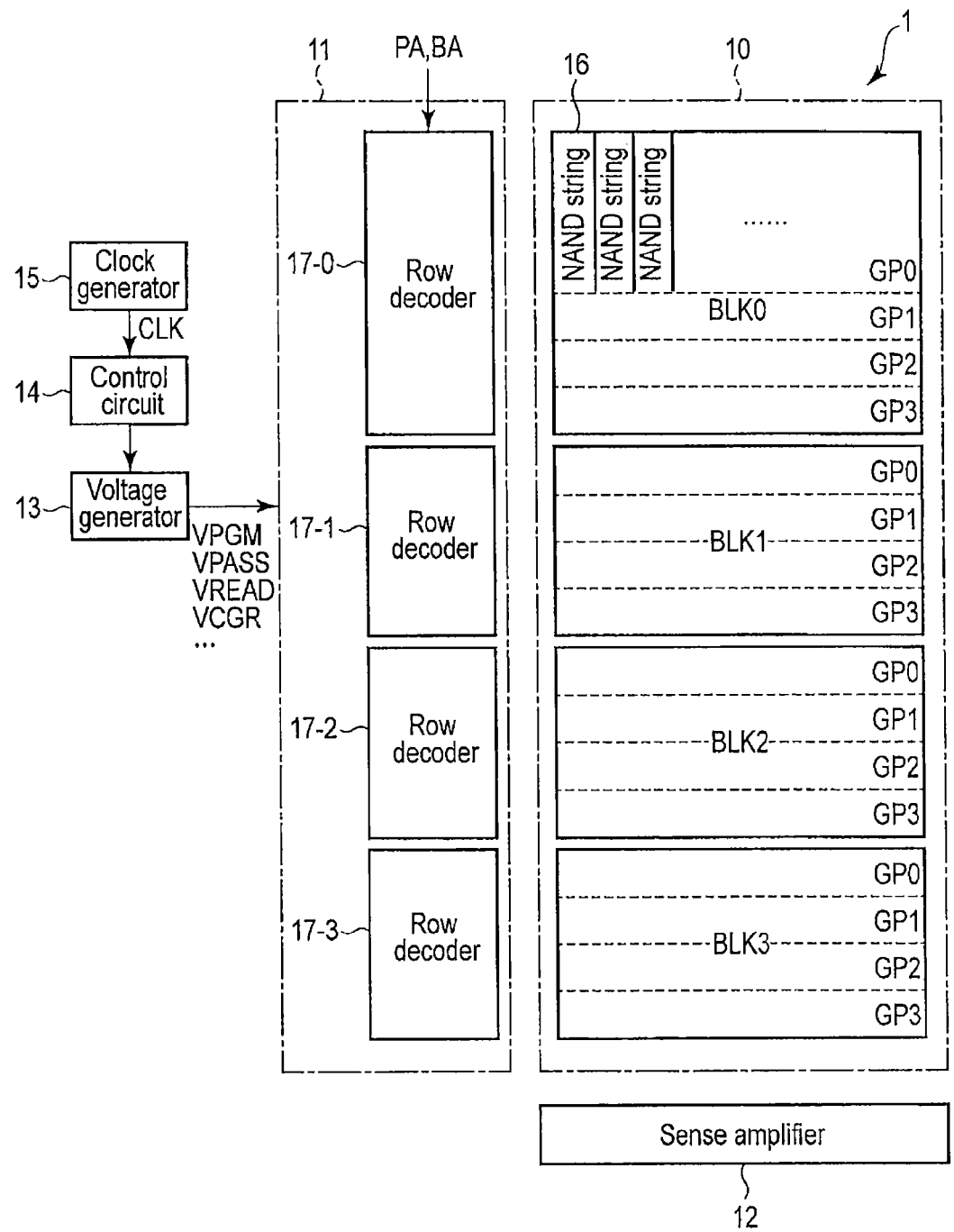
F I G. 1

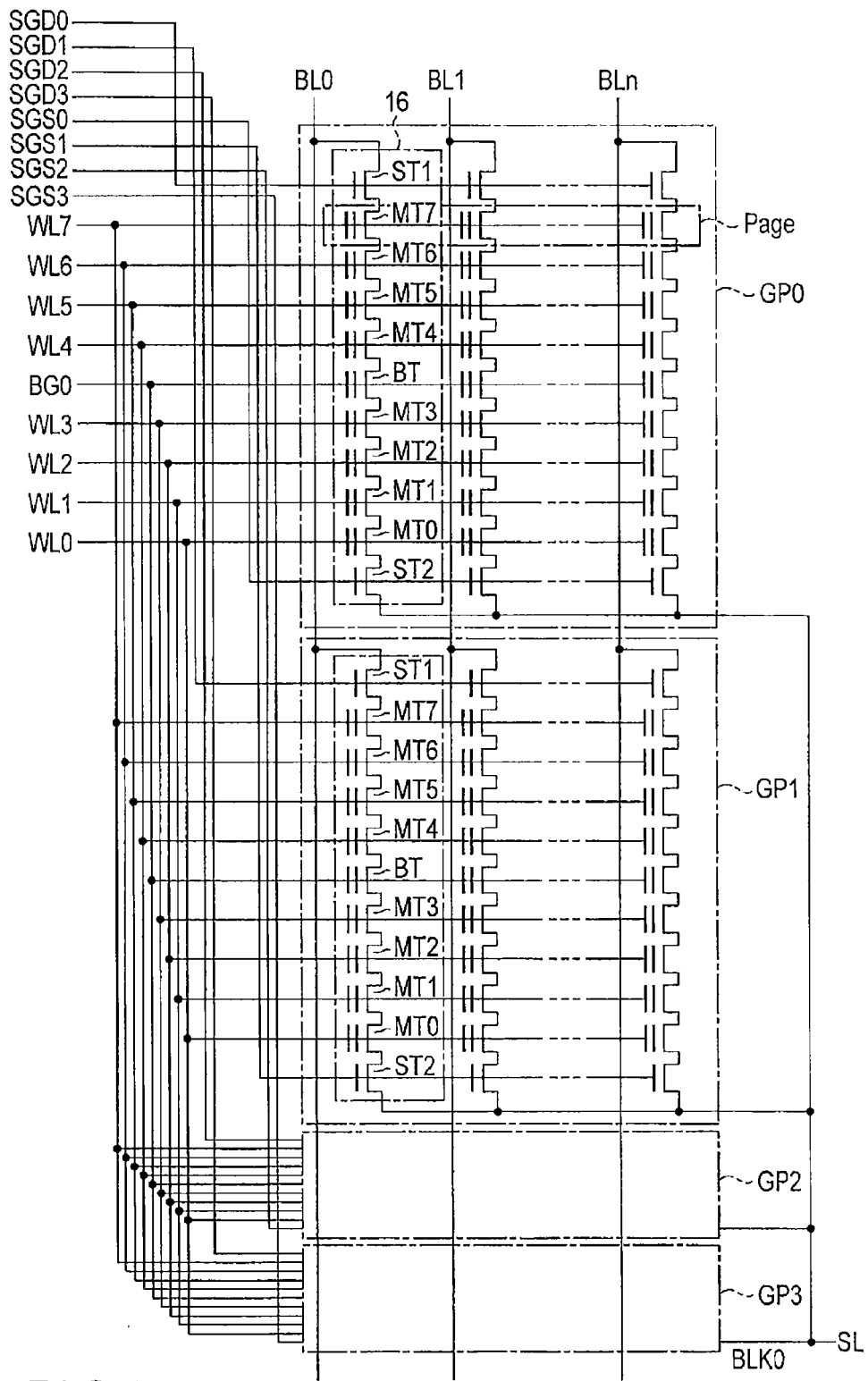
F I G. 2

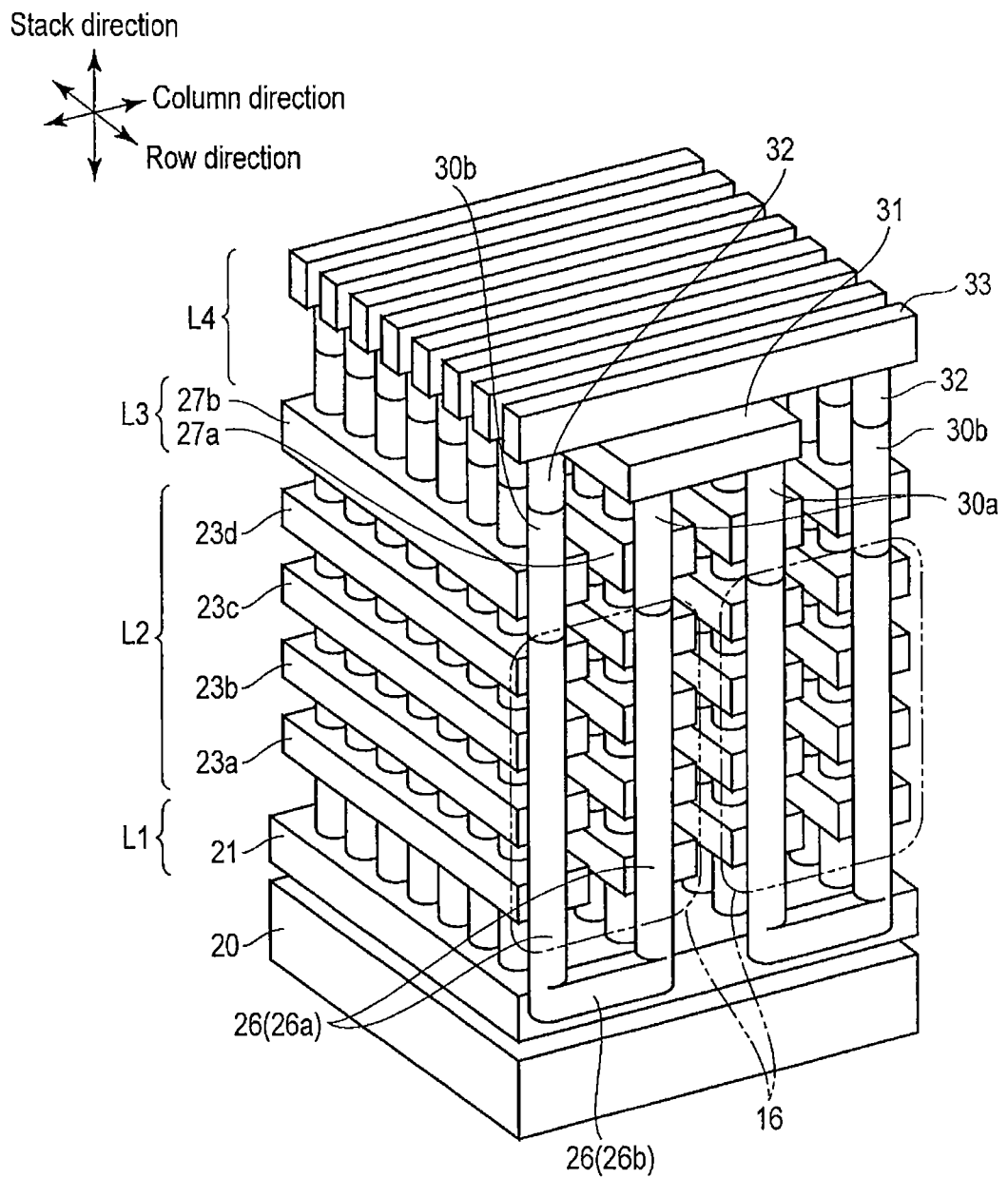
F I G. 3

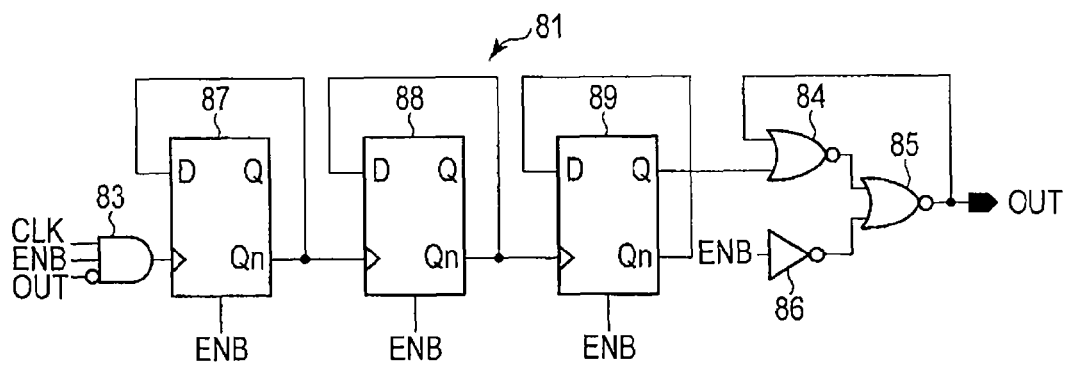
F I G. 7
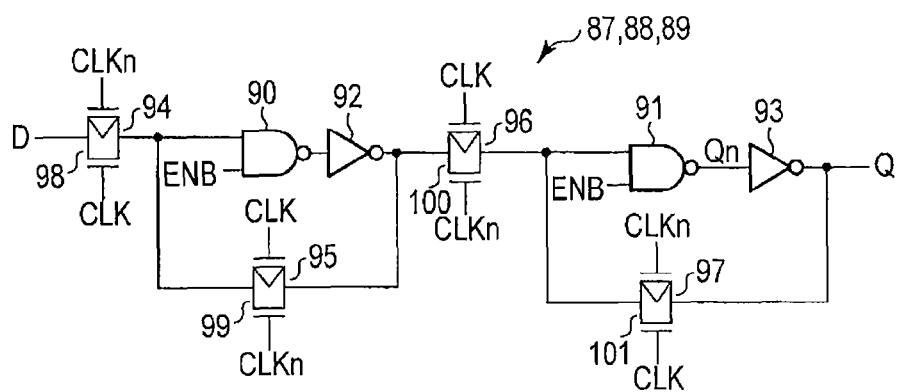
F I G. 8
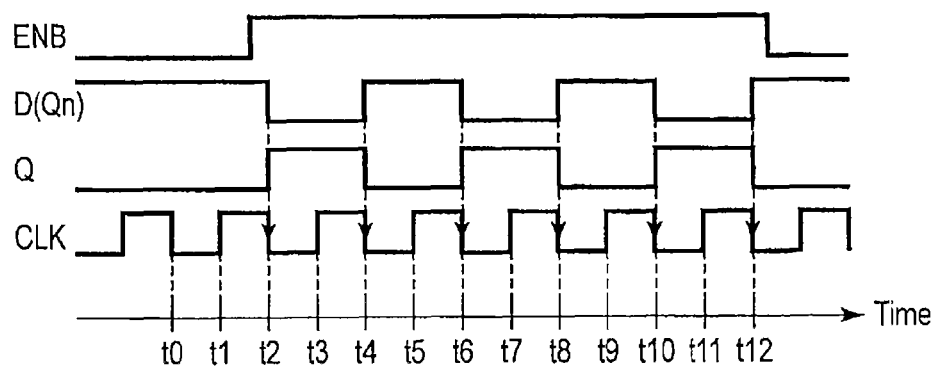
F I G. 9

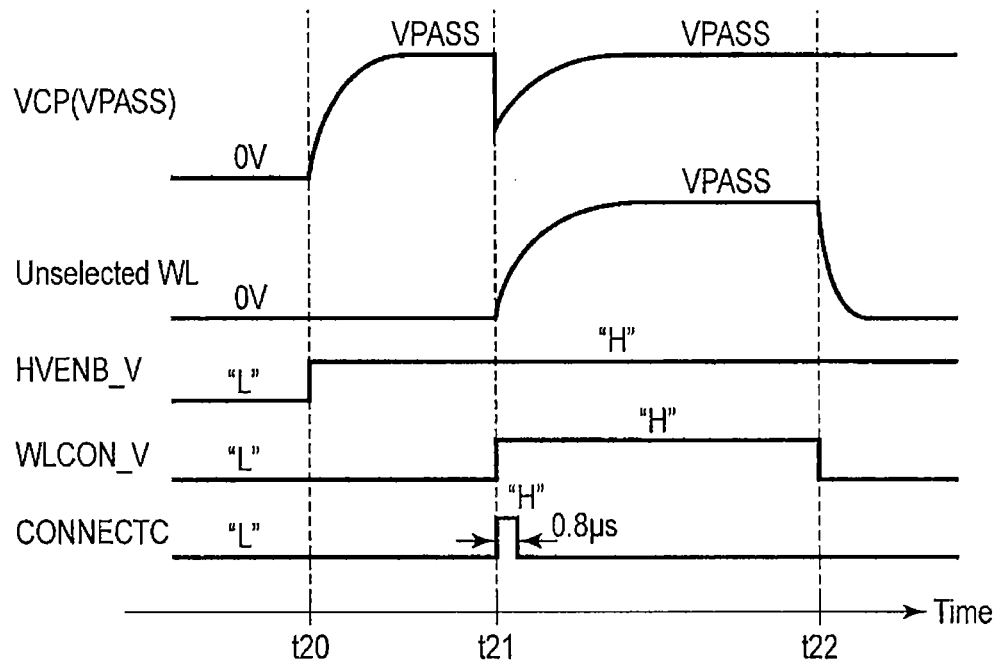
F I G. 10
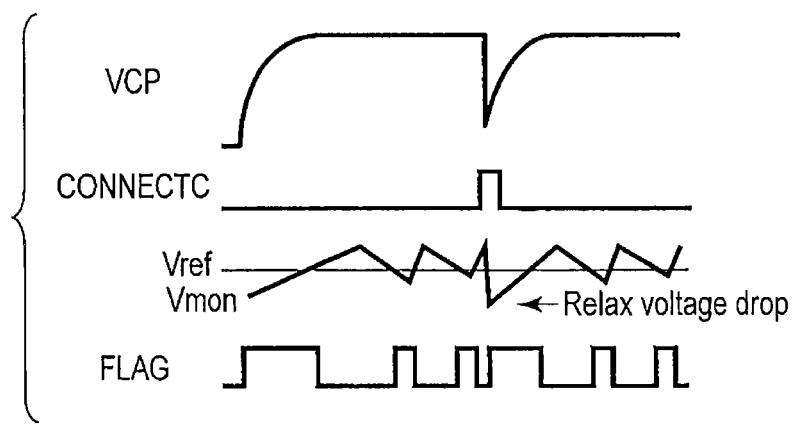
F I G. 11

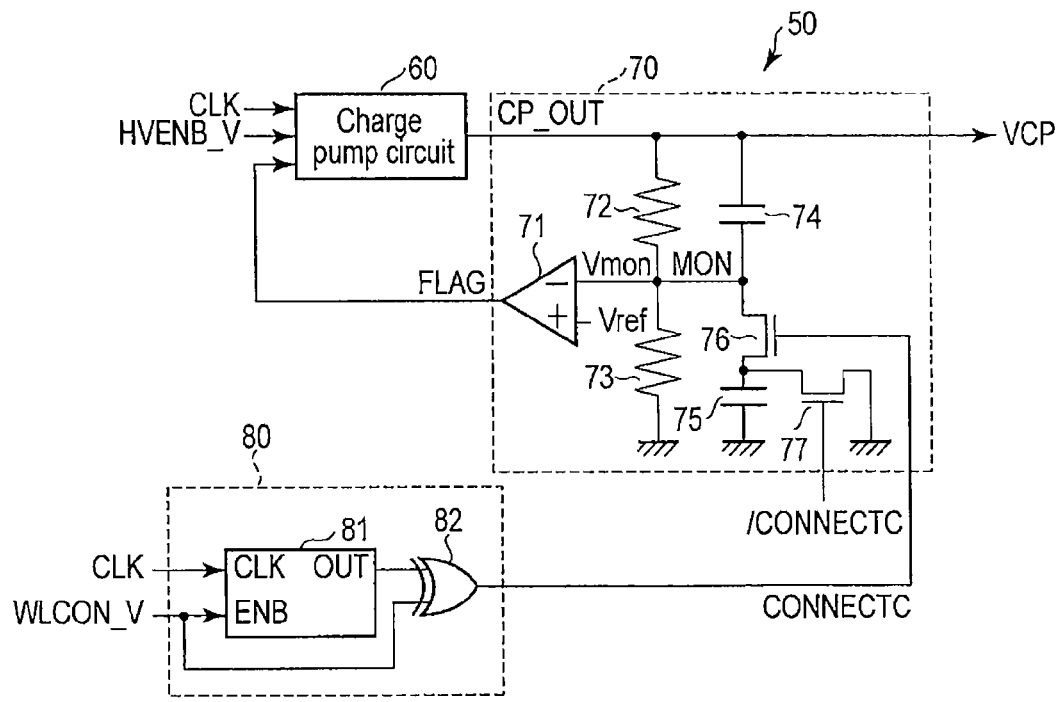
F I G. 12
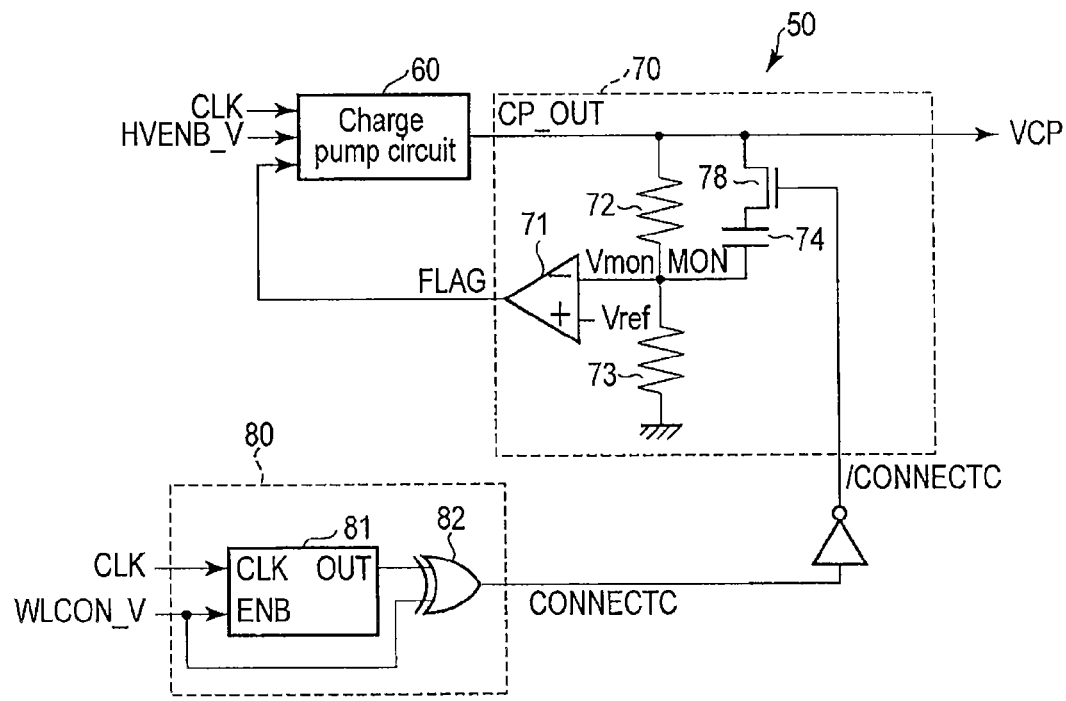
F I G. 13

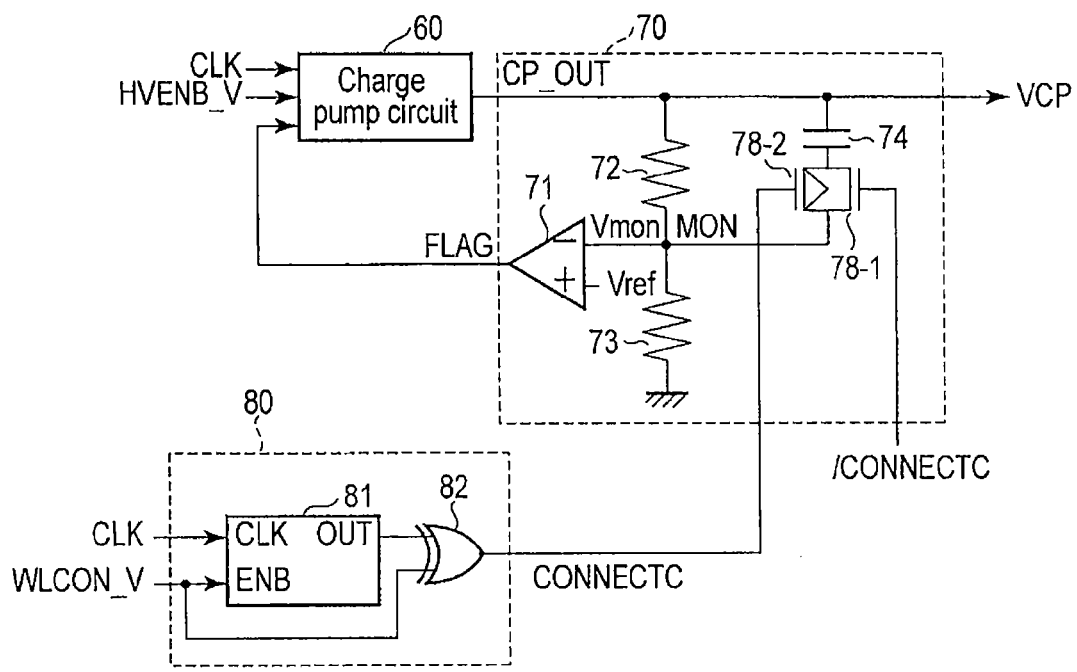
F I G. 14
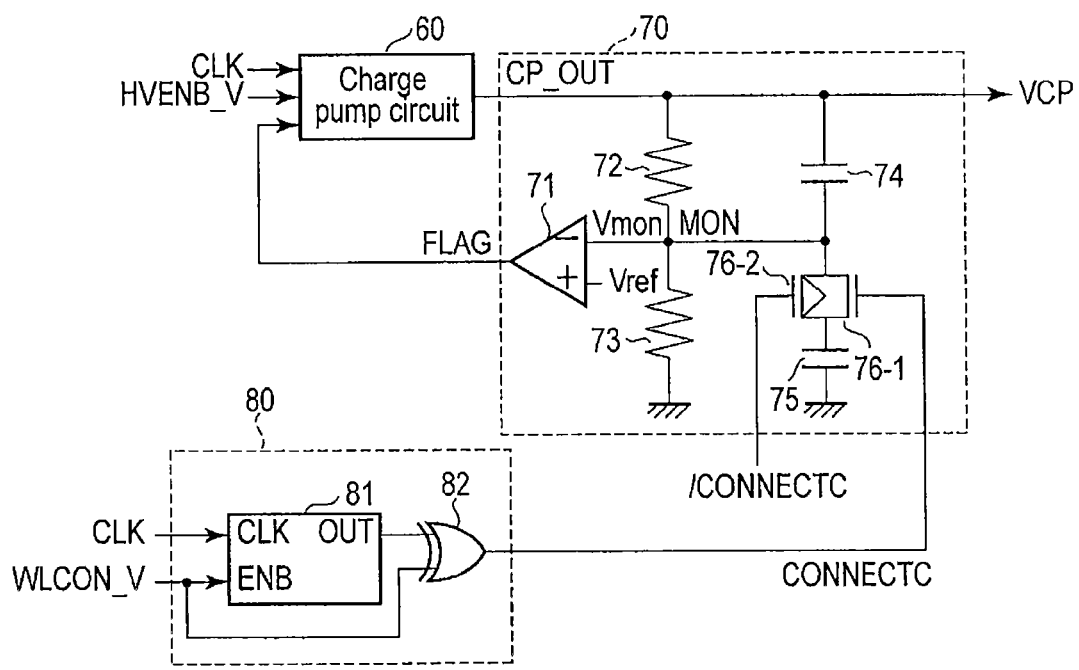
F I G. 15

US 8,797,089 B2

VOLTAGE GENERATOR

CROSS-REFERENCE TO RELATED APPLICATIONS

This application is based upon and claims the benefit of priority from Japanese Patent Application No. 2012-016707, filed Jan. 30, 2012, the entire contents of which are incorporated herein by reference.

FIELD

Embodiments described herein relate generally to a voltage generator.

BACKGROUND

In a nonvolatile semiconductor memory, the stability of a stepped-up potential is important.

BRIEF DESCRIPTION OF THE DRAWINGS

FIG. 1 is a block diagram of a semiconductor memory device according to a first embodiment;

FIG. 2, FIG. 3, and FIG. 4 are a circuit diagram, a perspective view, and a sectional view of a memory cell array according to the first embodiment, respectively;

FIG. 7 is a circuit diagram of a limiter controller according to the first embodiment;

FIG. 8 is a circuit diagram of a flip-flop according to the first embodiment;

FIG. 9 is a timing chart to explain an operation of the flip-flop of the first embodiment;

FIG. 10 is a timing chart for various signals in a write operation of the semiconductor memory device of the first embodiment;

FIG. 11 is a timing chart for various signals in operating the semiconductor memory device of the first embodiment;

FIG. 12 is a circuit diagram of a voltage generator according to a modification of the first embodiment;

FIG. 13 is a circuit diagram of a voltage generator according to a second embodiment;

FIG. 14 is a circuit diagram of a voltage generator according to a third embodiment;

FIG. 15 is a circuit diagram of a voltage generator according to a modification of the third embodiment;

DETAILED DESCRIPTION

Figure 4:
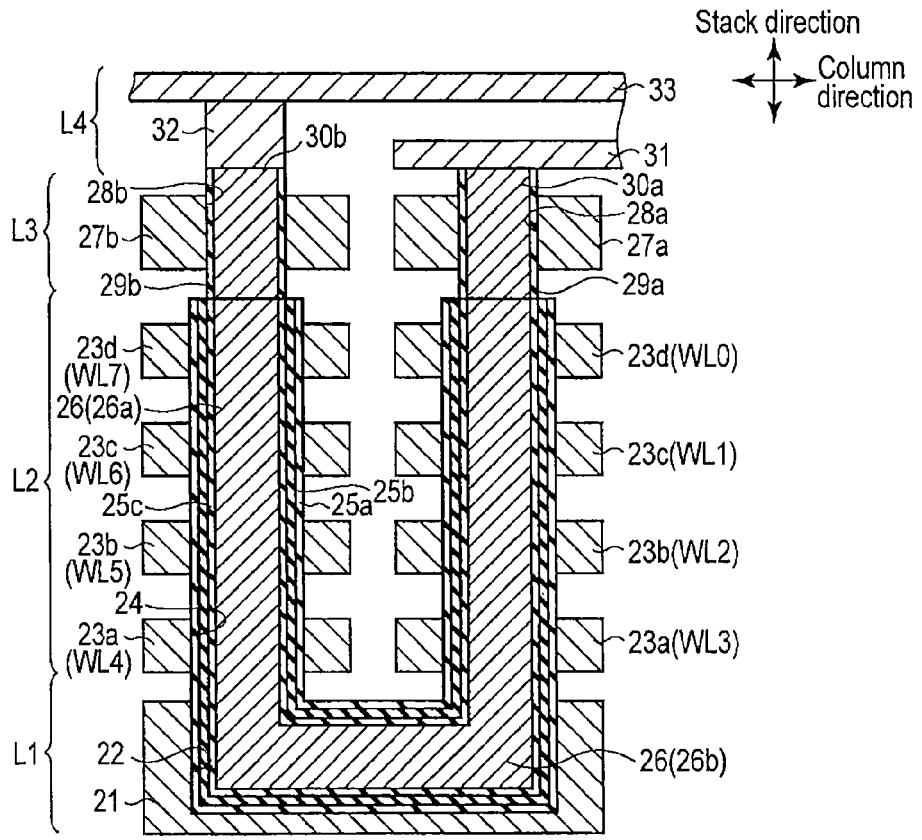

In general, according to one embodiment, a voltage generator includes: a step-up circuit; and a limiter circuit. The step-up circuit outputs a first voltage to a first node. The limiter circuit monitors a voltage at the first node and controls the step-up circuit. The limiter circuit includes: a first resistive element; a second resistive element; a first capacitive element; a second capacitive element; a first switch element; and a comparator. The first resistive element has one end connected to the first node and other end connected to a second node. The second resistive element has one end connected to the second node. The first capacitive element has one electrode connected to the first node and other electrode connected to the second node. The first switch element connects the second capacitive element to the second node at the same time that the first node is connected to a load. The comparator compares the potential at the second node with a reference potential and controls the step-up circuit according to the comparison result.

[First Embodiment]

A voltage generator and a semiconductor memory device according to a first embodiment will be explained. Hereinafter, a semiconductor memory device will be explained, taking as an example a three-dimensional stacked NAND flash memory where memory cells are stacked above a semiconductor substrate.

1. Configuration of Semiconductor Memory Device

First, the configuration of a semiconductor memory device according to the first embodiment will be explained.

1.1 Overall Configuration of Semiconductor Memory Device

FIG. 1 is a block diagram of a semiconductor memory device according to the first embodiment. As shown in FIG. 1, a NAND flash memory 1 includes a memory cell array 10, a decode module 11, a sense amplifier 12, a voltage generator 13, a control circuit 14, and a clock generator 15.

Memory cell array 10 includes a plurality of (four in the embodiment) blocks BLKs (BLK0 to BLK3) each being a set of nonvolatile memory cells. Data in the same block BLK is erased simultaneously. Each of blocks BLKs includes a plurality of (four in the embodiment) memory groups GPs (GP0 to GP3) each being a set of NAND strings 16 where memory cells are connected in series. Of course, the number of blocks in memory cell array 10 and the number of memory groups in each block BLK are both arbitrary.

Clock generator 15 generates a clock CLK.

Control circuit 14, which operates in synchronism with clock CLK, controls the operation of the entire NAND flash memory.

Under the control of control circuit 14, voltage generator 13 generates voltages necessary to write data, read data, and erase data.

Decode module 11 includes row decoders 17 (17-0 to 17-3) associated with blocks BLK0 to BLK3, respectively. Each of row decoders 17 selects a row direction of the associated block BLK and applies a necessary voltage to a memory cell in writing, reading, or erasing data.

Sense amplifier 12 senses and amplifies data read from a memory cell in reading data. When writing data, sense amplifier 12 transfers write-data to a memory cell.

1.2 Memory Cell Array 10

Next, a detailed configuration of memory cell array 10 will be explained. FIG. 2 is a circuit diagram of block BLK0. Each of blocks BLK1 to BLK3 has the same configuration.

As shown in FIG. 2, block BLK0 includes four memory groups GPs. Each of memory groups GPs includes n (n being a natural number) NAND strings 16.

Each of NAND strings 16 includes, for example, eight memory cell transistors MTs (MT0 to MT7), select transistors ST1 and ST2, and a back-gate transistor BT. Each of memory cell transistors MTs, which includes a stacked gate including a control gate and a charge accumulation layer, holds data in a nonvolatile manner. The number of memory cell transistors MTs is not limited to eight and may be 16, 32, 64, or 128. That is, the number is nonrestrictive. Like memory cell transistor MT, back-gate transistor BT includes a stacked gate including a control gate and a charge accumulation layer. Back-gate transistor BT is not for holding data and functions as just a current path in writing or erasing data. Memory cell transistors MTs and back-gate transistor BT are arranged between select transistors ST1 and ST2 in such a manner that their current paths are connected in series. Back-gate transistor BT is provided between memory cell transistors MT3 and MT4. The current path of memory cell transistor MT7 at one end of the series connection is connected to one end of the current path of select transistor ST1. The current path of memory cell transistor MT0 at the other end is connected to one end of the current path of select transistor ST2.

The gate of select transistor ST1 of each of memory groups GP0 to GP3 is connected to the associated one of select gate lines SGD0 to SGD3 in a common connection manner. The gate of select transistor ST2 of each of memory groups GP0 to GP3 is connected to the associated one of select gate lines SGS0 to SGS3 in a common connection manner. In contrast, the control gates of memory cell transistors MT0 to MT7 in the same block BLK0 are connected to word lines WL0 to WL7, respectively, in a common connection manner. The control gate of back-gate transistor BT is connected to a back-gate line BG in a common connection manner (that is, the control gates of back-gate transistors BT in blocks BLK0 to BLK3 are connected to BG0 to BG3, respectively).

Specifically, word lines WL0 to WL7 and back-gate line BG are shared by memory groups GP0 to GP3 in a common connection manner in the same block BLK0, whereas select gate lines SGD, SGS are independent of those in each of memory groups GP0 to GP3 even in the same block BLK0.

Of the NAND strings 16 arranged in a matrix in the memory cell array 10, the other ends of the current paths of select transistors ST1 of NAND strings 16 in the same row are connected to any one of bit lines (BL0 to BLn, n being a natural number) in a common connection manner. That is, a bit line BL connects NAND strings 16 between a plurality of blocks BLKs in a common connection manner. The other ends of the current paths of select transistors ST2 are connected to a source line SL in a common connection manner. Source line SL connects NAND strings 16 between, for example, a plurality of blocks in a common connection manner.

As described above, data in memory cell transistors MTs in the same block BLK is erased en bloc. In contrast, data is read from or written into, en bloc, a plurality of memory cell transistors MTs connected to any one of word lines WLs in any one of memory groups GPs in any one of blocks BLKs. This unit is called a page.

Next, a three-dimensional stacked structure of memory cell array 10 will be explained with reference to FIGS. 3 and 4. FIG. 3 is a perspective view of memory cell array 10. FIG. 4 is a sectional view of memory cell array 10.

As shown in FIGS. 3 and 4, memory cell array 10 is provided above a semiconductor substrate 20. Memory cell array 10 includes a back-gate transistor layer L1, a memory cell transistor layer L2, a select transistor layer L3, and an interconnect layer L4 formed sequentially on the semiconductor substrate 20.

Back-gate transistor layer L1 functions as a back-gate transistor BT. Memory cell transistor layer L2 functions as memory cell transistors MT0 to MT7 (NAND strings 16). Select transistor layer L3 functions as select transistors ST1 and ST2. Interconnect layer L4 functions as source lines SLs and bit lines BLs.

Back-gate transistor layer L1 includes a back-gate conducting layer 21. Back-gate conducting layer 21 is formed so as to expand in a row and a column direction parallel to semiconductor substrate 20. Back-gate conducting layer 21 is segmented block BLK by block BLK. Back-gate conducting layer 21 is made of, for example, polysilicon. Back-gate conducting layer 21 functions as a back-gate line BG.

In addition, back-gate conducting layer 21 has a back-gate hole 22 in it as shown in FIG. 4. Back-gate hole 22 is made so as to recess back-gate conducting layer 21. Back-gate hole 22 is made so as be almost rectangular in the column direction as a longitudinal direction when viewed from above.

Memory cell transistor layer L2 is formed on back-gate conducting layer L1. Memory cell transistor layer L2 includes word line conducting layers 23a to 23d. Word line conducting layers 23a to 23d are stacked one on top of another, with interlayer insulating layers (not shown) interposed therebetween. Word line conducting layers 23a to 23d are formed into stripes extending in the row direction with a specific pitch in the column direction. Word line conducting layers 23a to 23d are made of, for example, polysilicon. Word line conducting layer 23a functions as control gates (word lines WL3 and WL4) of memory cell transistors MT3 and MT4, word line conducting layer 23b functions as control gates (word lines WL2 and WL5) of memory cell transistors MT2 and MT5, word line conducting layer 23c functions as control gates (word lines WL1 and WL6) of memory cell transistors MT1 and MT6, and word line conducting layer 23d functions as control gates (word lines WL0 and WL7) of memory cell transistors MT0 and MT7.

As shown in FIG. 4, memory cell transistor layer L2 has a memory hole 24 in it. Memory hole 24 is made to extend through word line conducting layers 23a to 23d. Memory hole 24 is made to align with the end portion of back-gate hole 22 in the column direction.

Furthermore, as shown in FIG. 4, back-gate transistor layer L1 and memory cell transistor layer L2 include a block insulating layer 25a, a charge accumulation layer 25b, a tunnel insulating layer 25c, and a semiconductor layer 26. Semiconductor layer 26 functions as a body (or a back-gate of each transistor) of NAND string 16.

As shown in FIG. 4, block insulating layer 25a is formed to a specific thickness on the sidewall facing back-gate hole 22 and memory hole 25. Charge accumulation layer 25b is formed to a specific thickness on the side of block insulating layer 25a. Tunnel insulating layer 25c is formed to a specific thickness on the side of charge accumulation layer 25b. Semiconductor layer 26 is formed so as to contact the sidewall of tunnel insulating layer 25c. Semiconductor layer 26 is formed so as to fill back-gate hole 22 and memory hole 24.

Semiconductor layer 26 is formed into a U-shape when viewed from the row direction. That is, semiconductor layer 26 includes a pair of columnar parts 26a extending perpendicular to the surface of semiconductor substrate 20 and a connecting part 26b that connects the lower ends of the pair of columnar parts 26a.

Block insulating layer 25a and tunnel insulating layer 25c are made of, for example, silicon oxide ($SiO_2$). Charge accumulation layer 25b is made of, for example, silicon nitride (SiN). Semiconductor layer 26 is made of polysilicon. Block insulating layer 25a, charge accumulation layer 25b, tunnel insulating layer 25c, and semiconductor layer 26 form a MONOS transistor that functions as a memory cell transistor MT.

In other words, back-gate transistor layer L1 is so configured that tunnel insulating layer 25c is formed so as to surround connecting part 26b and that back-gate conducting layer 21 is formed so as to surround connecting part 26b.

Furthermore, memory cell transistor layer L2 is so configured that tunnel insulating layer 25c is formed so as to surround columnar part 26a, charge accumulation layer 25b is formed so as to surround tunnel insulating layer 25c, block insulating layer 25a is formed so as to surround charge accumulation layer 25b, and word line conducting layers 23a to 23d are formed so as to surround block insulating layers 25a to 25c and columnar part 26a.

As shown in FIGS. 3 and 4, select transistor layer L3 includes conducting layers 27a and 27b. Conducting layers 27a and 27b are formed into stripes extending in the row direction with a specific pitch in the column direction. A pair of conducting layers 27a and a pair of conducting layers 27b are arranged alternately in the column direction. Conducting layer 27a is formed on one columnar part 26a and conducting layer 27b is formed on the other columnar layer 26a.

Conducting layers 27a and 27b are made of polysilicon. Conducting layer 27a functions as the gate (select gate line SGS) of select transistor ST2. Conducting layer 27b functions as the gate (select gate line SGD) of select transistor ST1.

Select transistor layer L3 has holes 28a and 28b in it as shown in FIG. 4. Holes 28a and 28b respectively extend through conducting layers 27a and 27b. Holes 28a and 28b align with memory hole 24.

As shown in FIG. 4, select transistor layer L3 includes gate insulating layers 29a and 29b, and semiconductor layers 30a and 30b. Gate insulating layers 29a and 29b are formed on the sidewalls facing holes 28a and 28b, respectively. Semiconductor layers 30a and 30b are formed into columnar shapes extending in a direction perpendicular to the surface of semiconductor substrate 30 so as to contact gate insulating layers 29a and 29b, respectively.

Gate insulating layers 29a and 29b are made of, for example, silicon oxide ($SiO_2$). Semiconductor layers 30a and 30b are made of, for example, polysilicon.

In other words, select transistor layer L3 is so configured that gate insulating layer 29a is formed so as to surround columnar semiconductor layer 30a, conducting layer 27a is formed so as to surround gate insulating layer 29a and semiconductor layer 30a, gate insulating layer 29b is formed so as to surround columnar semiconductor layer 30b, and conducting layer 27b is formed so as to surround gate insulating layer 29b and semiconductor layer 30b.

Interconnect layer L4 is formed on select transistor layer L3 as shown in FIGS. 3 and 4. Interconnect layer L4 includes a source line layer 31, a plug layer 32, and a bit line layer 33. Source line layer 31 is formed into a plate extending in the row direction. Source line layer 31 is formed in contact with the upper surfaces of a pair of semiconductor layers 27a adjacent to each other in the column direction. Plug layer 32 is formed in contact with the upper surfaces of semiconductor layer 27b and extends in a direction perpendicular to the surface of semiconductor substrate 20. Bit line layers 33 are formed into stripes extending in the column direction with a specific pitch in the row direction. Bit line layers 33 are formed so as to contact the top surface of plug layer 32. Source line layer 31, plug layer 32, and bit line layers 33 are made of, for example, such metal as tungsten (W). Source line layer 31 functions as source line SL explained in FIGS. 1 and 2. Bit line layers 33 function as bit lines BLs.

Figure 5:
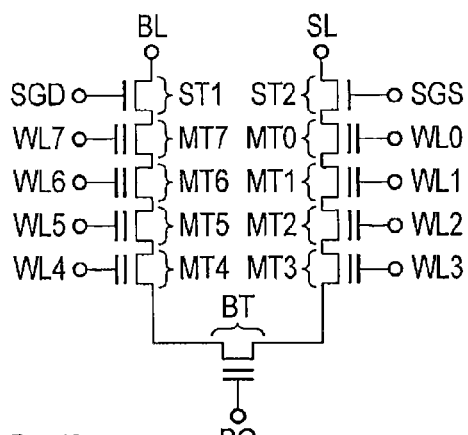
FIG. 5 is a circuit diagram of a NAND string according to the first embodiment.

FIG. 5 shows an equivalent circuit of NAND string 16 shown in FIGS. 3 and 4. As shown in FIG. 5, NAND string 16 includes select transistors ST1 and ST2, memory cell transistors MT0 to MT7, and a back-gate transistor BT. As described above, memory cell transistors MTs are connected in series between select transistors ST1 and ST2. Back-gate transistor BT is connected in series between memory cell transistors MT3 and MT4. In writing or reading data, back-gate transistor BT is always kept on.

The control gate of memory cell transistor MT is connected to a word line WL. The control gate of back-gate transistor BT is connected to a back-gate line BG. A set of a plurality of NAND strings 16 arranged in the row direction in FIG. 3 corresponds to a memory group GP explained in FIG. 2.

1.3 Row Decoder 17

Next, a configuration of row decoder 17 will be explained. Row decoders 17-0 to 17-3 are provided and associated with blocks BLK0 to BLK3 respectively to select or unselect blocks BLK0 to BLK3. Each of the row decoders 17-0 to 17-3 transfers a voltage generated by the voltage generator 13 to the word lines and select gate lines SGD, SGS in the associated block BLK.

Figure 6:
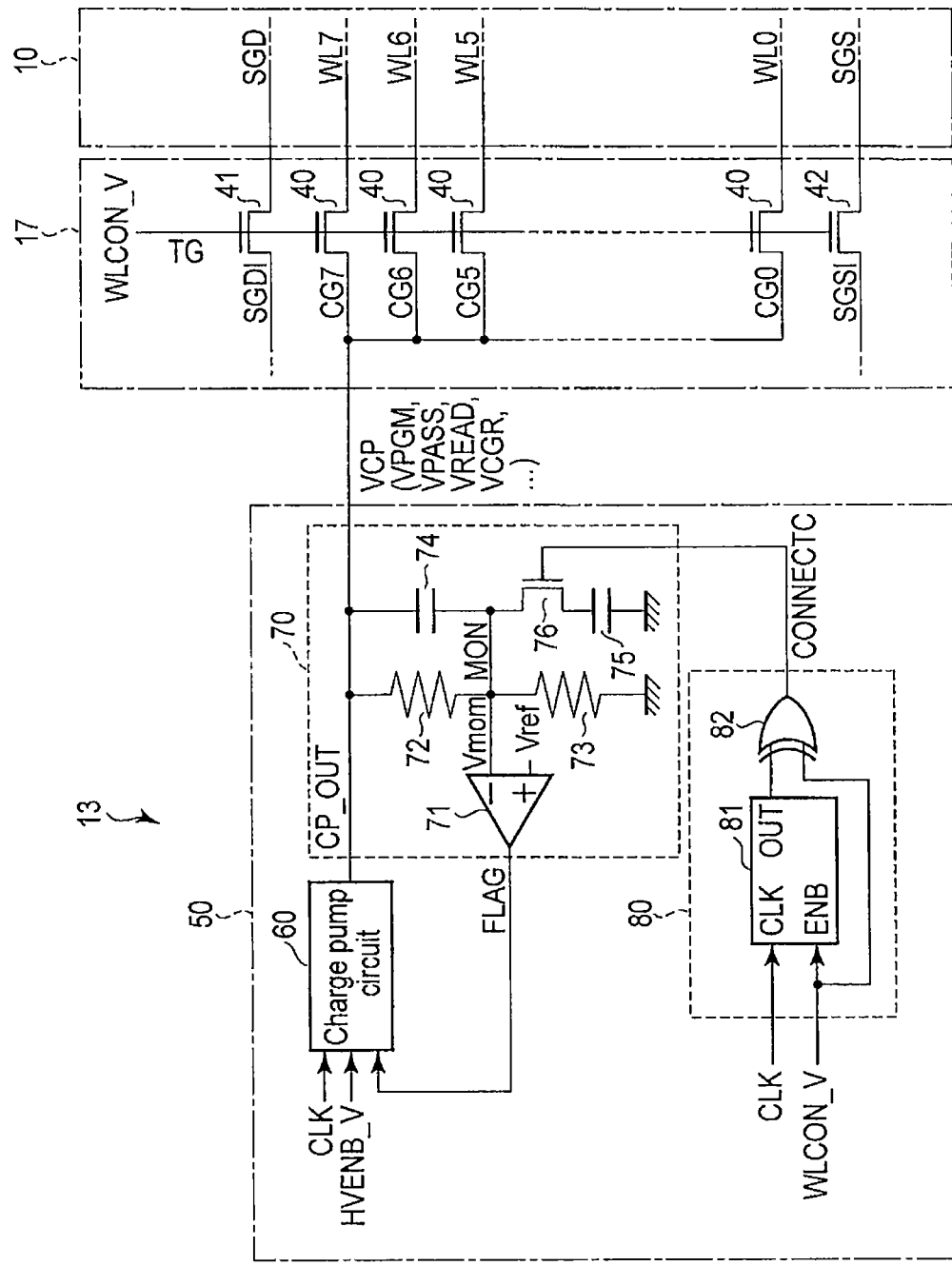
FIG. 6 is a block diagram of a row decoder and a voltage generator according to the first embodiment.

FIG. 6 is a circuit diagram of row decoder 17 associated with any one of blocks BLK and a voltage generation circuit included in voltage generator 13. As shown in FIG. 6, row decoder 17 includes high-voltage n-channel MOS transistors 40 to 42.

Transistors 40 are associated with word lines WL0 to WL7 respectively and transfer a voltage to the associated word lines WLs. That is, one end of the current path of each of transistors 40 is connected to one of word lines WL0 to WL7 in the associated block BLK. The other end of the current path is connected to the one of signal lines CG0 to CG7. The gates of transistors 40 are connected to a signal line TG in a common connection manner.

Transistors 41 and 42 transfer voltages to select gate lines SGD and SGS, respectively. One end of the current path of transistor 41 is connected to select gate line SGD in the associated block BLK and the other end is connected to signal line SGDI. One end of the current path of transistor 42 is connected to select gate line SGS in the associated block BLK and the other end is connected to signal line SGSI. The gates of transistors 41 and 42 are connected to the signal line TG in a common connection manner.

In each row decoder 17, transistors 40 are shared by a plurality of memory groups GPs in the associated block BLK. For example, in row decoder 17-0, a transistor 40 associated with word line WL0 is connected to word lines WL0 in four memory groups GP0 to GP3. On the other hand, transistors 41 and 42 are independent of those in another memory group from one memory group to another. That is, although only one transistor 41 and one transistor 42 are shown in FIG. 6, four transistors 41 and four transistors 42 are provided so as to be associated with memory groups GP0 to GP3.

Row decoder 17 further includes a driver circuit (not shown). The driver circuit supplies voltages to signal lines SGDI, SGSI. In addition, row decoder 17 includes a switch (not shown). With this switch, a necessary voltage is applied to signal lines CG0 to CG7. Just for reference, FIG. 6 shows the way the same voltage is applied to signal lines CG0 to CG7 by means of a switch.

Furthermore, for example, signal WLCON_V is supplied from control circuit 14 to signal line TG. Signal WLCON_V is asserted, turning on transistors 40 to 42. This causes a voltage generated by the voltage generator 13 to be transferred to a word line WL. A specific voltage is transferred to select gate lines SGD, SGS.

1.4 Voltage Generator 13

Next, a configuration of voltage generator 13 will be explained with reference to FIG. 6. Voltage generator 13 includes a plurality of voltage generation modules 50. Each of modules 50 generates voltages necessary to write, read, or erase data, including VPGM, VPASS, VREAD, VCGR, and VERA.

Voltage VPGM is a voltage applied to the selected word line in writing data. Voltage VPASS is a voltage applied to the unselected word lines in the selected block in writing data. Voltage VPASS turns on a memory cell transistor MT, regardless of whether the memory cell transistor holds data. Voltage VCGR is a voltage applied to the selected word line in reading data. Voltage VERA is a voltage applied to a bit line and/or a source line in erasing data.

Hereinafter, where there is no need to distinguish between those voltages, they will be collectively called the output voltage VCP of a voltage generation module 50. Although FIG. 6 shows only one voltage generation module 50, voltage generator 13 includes a plurality of voltage generation modules 50 that generate the aforementioned individual voltages. The switch (not shown) in row decoder 17 connects the corresponding one of voltage generation modules 50 to one of signal lines CG0 to CG7.

As shown in FIG. 6, each of voltage generation modules 50 includes a charge pump circuit 60, a limiter circuit 70, and a limiter controller 80.

Charge pump circuit 60 receives signal HVENBV supplied from, for example, control circuit 14, thereby being enabled. Then, having received a clock CLK, charge pump circuit 60 steps up a voltage. Charge pump circuit 60 then outputs the stepped-up voltage to a node CP_OUT. The voltage at node CP_OUT is output as a stepped-up voltage VCP (specifically, VPGM, VPASS, VREAD, or the like) from voltage generation module 50.

Limiter circuit 70 monitors the potential at node CP_OUT to generate a flag FLAG and controls charge pump circuit 60 so that voltage VCP may reach a desired value. As shown in FIG. 6, limiter circuit 70 includes a comparator 71, resistive elements 72 and 73, capacitive elements 74 and 75, and an n-channel MOS transistor 76.

One end of resistive element 72 is connected to node CP_OUT and the other end of it is connected to node MON. One end of resistive element 73 is connected to node MON and the other end of it is grounded. One electrode of capacitive element 74 is connected to node CP_OUT and the other electrode of it is connected to node MON. Transistor 76 has its drain connected to node MON and its source connected to one electrode of capacitive element 75. A signal CONNECTC is input to the gate of transistor 76. Transistor 76 is a low-withstand-voltage MOS transistor. For example, the gate insulating film of transistor 76 is thinner than that of high-withstand-voltage MOS transistor 40 in the row decoder 17. The other electrode of capacitive element 75 is grounded. Comparator 71 includes an inverting input terminal to which a voltage Vmon at node MON is input, a noninverting input terminal to which a reference voltage Vref is input, and an output terminal that outputs a flag FLAG according to the result of comparison between Vmon and Vref.

With the above configuration, limiter circuit 70 controls charge pump circuit 60 by flag FLAG. Specifically, when Vref is higher than Vmon, FLAG is set (FLAG=High), stepping up the voltage of charge pump circuit 60. In contrast, when Vref is lower than Vmon, FLAG is cleared (FLAG=Low), stopping the step-up of the voltage of the charge pump circuit 60.

Limiter controller 80 generates a signal CONNECTC according to clock CLK and signal WLCON_V. Limiter controller 80 turns on transistor 76 the instant transistor 40 of row decoder 17 connects voltage generation module 50 to a word line WL. As shown in FIG. 6, limiter controller 80 includes a controller 81 and an exclusive OR (XOR) gate 82.

Controller 81 receives a clock CLK at a clock input terminal and a signal WLCON_V at an enable terminal ENB and outputs an output signal at output terminal OUT. XOR gate 82 executes XOR operation of signal WLCON_V and the output signal of the controller 81, and outputs the result as signal CONNECTC.

FIG. 7 is a circuit diagram of controller 81. As shown in FIG. 7, controller 81 includes an AND gate 83, NOR gates 84 and 85, an inverter 86, and flip-flops (D-F/Fs) 87 to 89.

AND gate receives clock CLK at the clock terminal, signal WLCON_V at the enable terminal ENB, and an inversion signal of the output signal at the output terminal OUT, and executes AND operation of CLK, WLCON_V, and the inversion signal. In flip-flop 87, a reset terminal is connected to enable terminal ENB. Flip-flop 87 receives the output signal of AND gate 83 as a clock. Inverting output terminal Qn of flip-flop 87 is connected to input terminal D of flip-flop 87. In flip-flop 88, a reset terminal is connected to enable terminal ENB. Flip-flop 88 receives the signal from terminal Qn of flip-flop 87 as a clock. Inverting output terminal Qn of flip-flop 88 is connected to input terminal D of flip-flop 88. In flip-flop 89, a reset terminal is connected to enable terminal ENB. Flip-flop 89 receives the signal from terminal Qn of flip-flop 88 as a clock. Inverting output terminal Qn of flip-flop 89 is connected to input terminal D of flip-flop 89. NOR gate 84 executes NOR operation of the signal from output terminal Q of flip-flop 89 and the signal from output terminal OUT. Inverter 86 inverts signal WLCON_V. NOR gate 85 executes NOR operation of the operation result of NOR gate 84 and the operation result of inverter 86. The operation result of NOR gate 85 is output at output terminal OUT.

FIG. 8 is a circuit diagram of flip-flops 87 to 89. Each of flip-flops 87 to 89 includes NAND gates 90 and 91, inverters 92 and 93, p-channel MOS transistors 94 to 97, and n-channel MOS transistors 98 to 101.

An inverted clock CLKn is input to the gate of transistor 94 and a clock CLK is input to the gate of transistor 98. One end of the current path of transistors 94 and 98 is connected to input terminal D. NAND gate 90 executes NAND operation of a signal at the other end of the current path of transistors 94 and 98 and the signal at terminal ENS. Inverter 92 inverts the operation result of NAND gate 90. CLK is input to the gate of transistor 95 and CLKn is input to the gate of transistor 59. One end of the current path of transistors 95 and 99 is connected to the other end of the current path of transistors 94 and 98. CLK is input to the gate of transistor 96 and CLKn is input to the gate of transistor 100. One end of the current path of transistors 96 and 100 is connected to the output of inverter 92 and to the other end of the current path of transistors 95 and 99. NAND gate 91 executes NAND operation of a signal at the other end of the current path of transistors 96 and 100 and the signal at terminal ENB. Inverter 93 inverts the operation result of NAND gate 91. CLKn is input to the gate of transistor 97 and CLK is input to the gate of transistor 101. One end of the current path of transistors 97 and 101 is connected to the other end of the current path of transistors 96 and 100.

With the above configuration, the output of inverter 93 makes terminal Q and the output terminal of NAND gate 91 makes terminal Qn.

FIG. 9 is a timing chart to explain an operation of each of flip-flops 87 to 89, showing signals at terminal ENB, terminal D (Qn), and terminal Q and a clock CLK. As described above, the signal at terminal ENB is WLCON_V. As shown in FIG. 9, each of flip-flops 87 to 89 detects a falling edge of clock CLK. A signal that rises or falls at the falling edge of the CLK is output at terminal Q or Qn.

Controller 81 is configured to have the aforementioned flip-flops connected in series, thereby functioning as a delay circuit. The length of delay time can be changed arbitrarily by changing the number of stages of flip-flops, the frequency of CLK, or flip-flops that input an output signal to the NOR gate 84.

2. Operation of Semiconductor Memory Device 1

Next, an operation of the NAND flash memory configured as described above will be explained. First, a write operation and a read operation will be explained briefly.

2.1 Write Operation

First, a write operation will be explained. In a write operation, voltage generation module 50 generates voltages VPGM and VPASS.

In row decoder 17 associated with the selected block, signal WLCON_V is asserted (made high). Then, signal line CG associated with the selected word line is connected to node CP_OUT of voltage generation module 50 that generates VPGM. Signal lines CGs associated with the unselected word lines are connected to node CP_OUT of voltage generation module 50 that generates VPASS. In addition, 0 V is transferred to select gate line SGS and voltage VSG is transferred to select gate line SGD.

Then, sense amplifier 12 applies a specific voltage to a bit line BL. In a column where data is to be programmed, select transistor ST1 is turned on, causing program-data to be transferred to the selected memory cell transistor. As a result, charge is injected into the charge accumulation layer, thereby programming data. In contrast, in a column where data is not to be programmed, a high voltage is applied to bit line BL, cutting off select transistor ST1. This makes the channel potential of NAND string 16 in the column electrically floating, with the result that the potential rises by coupling with a word line WL. As a result, charge is not injected into the charge accumulation layer, preventing data from being programmed.

2.2 Read Operation

Next, a read operation will be explained. In a read operation, voltage generation module 50 generates voltages VCGR and VREAD.

In row decoder 17 associated with the selected block, signal WLCON_V is asserted (made high). Then, signal line CG associated with the selected word line is connected to node CP_OUT of voltage generation module 50 that generates VCGR. Signal lines CGs associated with the unselected word lines are connected to node CP_OUT of voltage generation module 50 that generates VREAD. In addition, voltage VH is transferred to select gate lines SGD and SGS. Voltage VH is a voltage that turns on select transistors ST1 and ST2.

Then, sense amplifier 12 applies a specific voltage to a bit line BL. If the selected memory cell transistor MT goes on, current flows from bit line BL to source line SL. In contrast, if the selected memory cell transistor MT goes off, no current flows from bit line BL to source line SL. Sense amplifier 12 determines the read data by sensing the current.

2.3 Operation of Voltage Generation Module 50

Next, an operation of voltage generation module 50 in the write operation or read operation (also or an erase operation) will be explained with reference to FIG. 10. FIG. 10 is a timing chart for voltage VCP (VPASS in the embodiment), the potential of an unselected word line, signals HVENB_V, WLCON_V, and CONNECTC in a write operation.

As shown in FIG. 10, at time t20, for example, control circuit 14 asserts (or makes high) signal HVENB_V, starting up charge pump circuit 60. The charge pump circuit 60 steps-up a voltage and outputs a voltage VCP to node CP_OUT.

After voltage VCP has risen gradually and reached voltage VPASS, control circuit 14 asserts (or makes high) signal WLCON_V at time t21. At the same time that signal WLCON_V is asserted, limiter controller 80 asserts (or makes high) signal CONNECTC. When signal WLCON_V has been asserted, this connects node CP_OUT of voltage generation module 50 that generates VPASS to the unselected word line WL. As a result, the potential of the unselected word line rises and reaches voltage VPASS. In addition, voltage VCP drops sharply from VPASS the instant node CP_OUT is connected to a word line WL. After that, the voltage rises again and reaches VPASS. The period during which signal CONNECTC is asserted is, for example, about 0.8 μs. Signal CONNECTC is negated (or made low) before VCP returns to VPASS after having dropped sharply at time t21.

When the writing of data has been completed (at time t22), signal WLCON_V is negated (or made low), setting the unselected word line WL to 0 V.

In FIG. 10, voltage VPASS has been taken as an example. The same holds true for other voltages, including VPGM and VREAD.

3. Effects of the First Embodiment

With the configuration of the first embodiment, a stepped-up voltage can be made more stable and therefore the operation reliability of the NAND flash memory can be improved. This effect will be explained below.

In a high-voltage analog system, a desired high voltage is generated using a regulator circuit. Generally, a regulator detects a set voltage and controls a clock of a step-up circuit according to the detection result. The regulator includes a resistive divider and a differential amplifier. A reference voltage and a bias voltage are generated by a low-voltage analog system.

Generally, a regulator circuit is so configured that capacitive elements 74 and 75 and transistor 76 are eliminated in the limiter circuit 70 of FIG. 6. With this configuration, the following problem arises: a part Idc of the direct-current component of current Iout output from the charge pump circuit 60 to node CP_OUT flows into resistive element 72. Therefore, only amounts of (Iout-Idc) can be used to charge a word line WL. Accordingly, it is preferable to make Idc smaller. To achieve this, it is necessary to increase the resistances of resistive elements 72 and 73.

Unfortunately, when the size of resistive element 72 is made larger to increase the resistance of resistive element 72, the capacitance between resistive element 72 and the semiconductor substrate also increases, making an RC delay larger. As a result, the following response of Vmon to CPout deteriorates, decreasing the stability of CPout near a regulation level, which results in an increase in the ripple of the stepped-up potential.

Therefore, use of capacitive element 74 enables an AC delay to be made smaller, which makes it possible not only to decrease Idc but also to suppress the ripple. However, when capacitive element 74 is used, a decrease in the voltage Vmon the instant node CP_OUT is connected to a load (word line WL) is noticeable. Depending on circumstances, Vmon may fall to a negative value, causing a forward bias in a p-n junction, which contributes to a decrease in the operation reliability of the circuit.

This problem is overcome by providing capacitive element 75 and transistor 76 in the configuration of the first embodiment. FIG. 11 is a timing chart for the voltage VCP, signal CONNECTC, voltages Vref, Vmon, and flag FLAG. As shown in FIG. 11, immediately after switch 40 of row decoder 17 has been turned on, the value of VCP falls sharply. However, with the configuration of the first embodiment, transistor 76 is turned on at the same time switch 40 goes on, causing capacitive element 75 to be connected to node MON. This makes larger a capacitive load of limiter circuit 70. As a result, an excessive drop in Vmon can be suppressed.

Excluding the instance switch circuit 40 goes on, transistor 76 is off. Therefore, in the remaining period, capacitive element 75 has no effect on the operation of limiter 70. Accordingly, a large drop in Vmon can be suppressed, while making Idc smaller and keeping the following response of Vmon to Iout.

4. Modification of the First Embodiment

FIG. 12 is a circuit diagram of a voltage generator according to a modification of the first embodiment. The configuration is such that an re-channel MOS transistor 77 is further added to the configuration explained in FIG. 6. Transistor 77 has its drain connected to one electrode of capacitive element 75 and its source grounded. A signal /CONNECTC is input to the gate of transistor 77. Signal /CONNECTC is an inverted signal of signal CONNECTC.

With this configuration, transistor 77 is turned on during the period before time t21 in FIG. 10. Therefore, the potential at one electrode of capacitive element 75 is prevented from becoming floating. Therefore, at the instant of turning on transistor 40 of row decoder 17, a fluctuation in Vmon caused by charge sharing can be suppressed.

While in the example of FIG. 12, an example of setting one electrode of capacitive element 75 at the ground potential has been explained, a reference voltage that has a certain positive value may be used.

[Second Embodiment]

Next, a voltage generator and a semiconductor memory device according to a second embodiment will be explained. The second embodiment is such that capacitive element 74 is disconnected from node CP_OUT at the same time that the voltage generation module 50 is connected to a word line WL in the first embodiment. Hereinafter, only what differs from the first embodiment will be explained.

1. Configuration of Voltage Generation Module 50

FIG. 13 is a circuit diagram of a voltage generation module 50 according to the second embodiment. As shown in FIG. 13, voltage generation module 50 of the second embodiment is such that voltage generation module 50 explained with reference to FIG. 6 is modified as follows:

(1) Capacitive element 75 and transistor 76 have been eliminated.

(2) An n-channel MOS transistor 78 is provided between capacitive element 74 and node CP_OUT. Transistor 78 has its drain connected to node CP_OUT and its source connected to one electrode of capacitive element 74. A signal /CONNECTC is input to the gate of transistor 78. Transistor 78, which is a high-withstand-voltage transistor, includes a gate insulating film whose thickness is almost the same as that of transistor 40.

2. Effects of the Second Embodiment

With the configuration of the second embodiment, the moment node CP_OUT is connected to a word line WL, signal /CONNECTC is made low, turning off transistor 78. This disconnects capacitive element 74 from node CP_OUT. Therefore, a sharp drop in voltage Vmon the moment node CP_OUT is connected to a word line WL can be suppressed.

During the rest period, signal /CONNECTC is high and therefore capacitive element 74 is connected to node CP_OUT. Accordingly, capacitive element 74 enables an AC delay to be made smaller and the following response of Vmon to Iout to be secured.

[Third Embodiment]

Next, a voltage generator and a semiconductor memory device according to a third embodiment will be explained. The third embodiment is such that transistor 78 is replaced with a transfer gate in the second embodiment. Hereinafter, only what differs from the second embodiment will be explained.

1. Configuration of Voltage Generation Module 50

FIG. 14 is a circuit diagram of a voltage generation module 50 according to the third embodiment. As shown in FIG. 14, voltage generation module 50 of the third embodiment is such that voltage generation module 50 explained with reference to FIG. 13 is modified as follows:

(1) A transistor 78 is provided between the other electrode of capacitive element 74 and node MON.

(2) Transistor 78 is replaced with a pair of an re-channel MOS transistor 78-1 and a p-channel MOS transistor 78-2. Transistors 78-1 and 78-2 have their drain connected to the other electrode of capacitive element 74 and their source connected to node MON. Signal /CONNECTC is input to the gate of transistor 78-1 and signal CONNECTC is input to the gate of transistor 78-2. Transistors 78-1 and 78-2, which are low-withstand-voltage transistors, include gate insulating films whose film thickness is smaller than that of a high-withstand-voltage transistor, such as transistor 40.

2. Effects of the Third Embodiment

The configuration of the third embodiment produces not only the effect explained in the second embodiment but also the effect of preventing coupling noise from occurring in Vmon via the gate capacitance of the transistor in disconnecting capacitive element 74.

Specifically, with the third embodiment, the moment node CP_OUT is connected to a word line WL, the gate of transistor 78-1 transits from a high level to a low level and the gate of transistor 78-2 transits from the low level to the high level. Therefore, switching noise of transistors 78-1 and 78-2 is offset by a component resulting from the transition from the high level to the low level and by a component resulting from the transition from the low level to the high level.

This makes it possible to reduce noise in the voltage Vmon.

3. Modification of the Third Embodiment

The third embodiment can be applied to the first embodiment. Such an example is shown in FIG. 15. FIG. 15 is a circuit diagram of a voltage generation module 50. As shown in FIG. 15, a transistor 76 may be replaced with a transfer gate including a low-withstand-voltage n-channel MOS transistor 76-1 and a low-withstand-voltage p-channel MOS transistor 76-2. Even this configuration produces the same effects.

[Fourth Embodiment]

Next, a voltage generator and a semiconductor memory device according to a fourth embodiment will be explained. The fourth embodiment relates to a configuration of resistive element 73 in the first to third embodiments. Hereinafter, only resistive element 73 will be explained.

1. First Example

Figure 16:
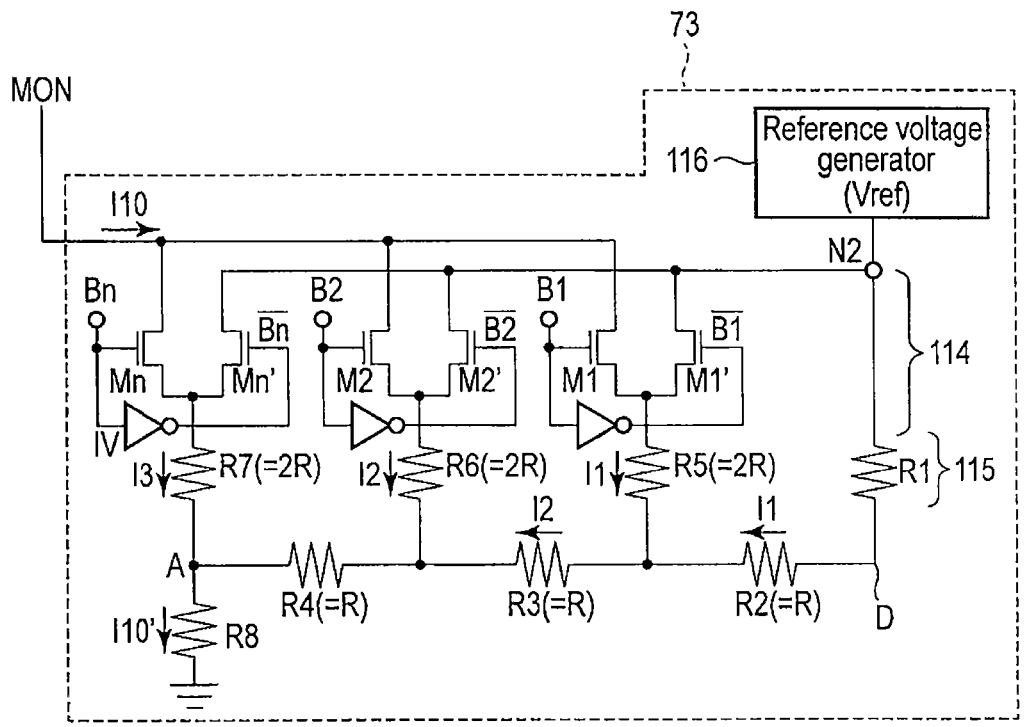
FIG. 16 and FIG. 17 are circuit diagrams of a digital-to-analog converter included in a voltage generator according to a fourth embodiment.

In a first example, a current-addition R-2R digital-to-analog converter is used as resistive element 73. FIG. 16 is a circuit diagram of the R-2R digital-to-analog converter.

As shown in FIG. 16, a plurality of first switch elements M1 to Mn (n being a natural number not less than 2) have their one end connected to node MON in a common connection manner and are subjected to switching control so as to correspond to digital-input bit signals B1 to Bn, respectively. A plurality of second switch elements M1' to Mn' have their one end connected to node N2 in a common connection manner and are subjected to switching control so as to correspond to signals /B1 to /Bn, respectively, obtained by inverting the digital-input bit signals B1 to Bn with inverter circuits IVs.

The other ends of the first switch elements M1 to Mn and those of the second switch elements M1' to Mn' subjected to switching control complementarily are connected in such a manner that those corresponding to each other are connected in a common connection manner. Switch elements M1 to Mn, M1' to Mn' form a switching network 114 that is subjected to switching control whereby either node MON or node N2 is selected according to complementary bit signals B1 to Bn, /B1 to /Bn in the digital inputs.

A ladder resistance network 115 is so configured that a plurality of (n) first resistive elements R5 to R7 and a plurality of (n+1) second resistive elements R1 to R4 one end of each of which is connected to a common connection node of the corresponding switch elements are connected in a ladder structure. Assuming the resistance of each of second resistive elements R1 to R4 is expressed as R, the resistance of each of first resistive elements R5 to R7 is set to 2R.

A third resistive element R8 is connected between one end of a second resistive element group (R1 to R4) of the ladder resistance network 115 and a Vss node.

A reference voltage generator 116, which is to apply a reference potential Vref to node N2, has a low impedance.

As described above, a current-addition R-2R digital-to-analog conversion circuit where the ladder resistance network 115 is connected to the switching network 114 can be used as resistive element 73. Such a current-addition R-2R digital-to-analog conversion circuit has been written in U.S. Pat. No. 6,404,274 (application Ser. No. 09/289,413, Jpn. Pat. Appln. KOKAI Publication No. 11-353889) which is incorporated herein by reference. Such a circuit can be used as resistive element 73.

2. Second Example

Figure 17:
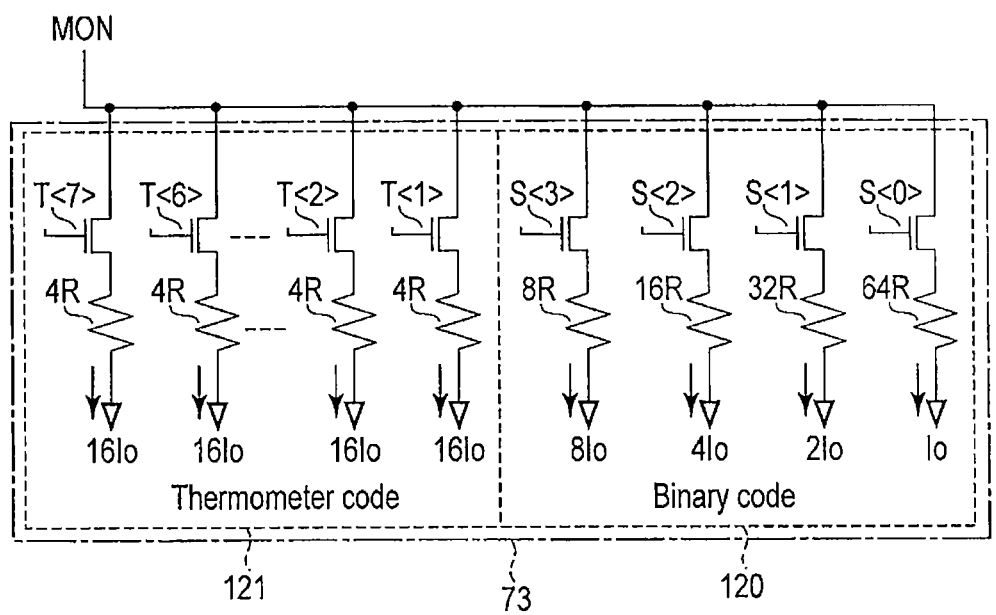

In a second example, a current-addition digital-to-analog converter using binary code and thermometer code is used as resistive element 73. FIG. 17 is a circuit diagram of current-addition digital-to-analog converter using binary code and thermometer code.

As shown in FIG. 17, resistive element 73 may be replaced with a digital-to-analog converter including a binary current-addition module 120 and a thermometer code current-addition module 121.

In binary current-addition module 120, resistive elements are arranged so that current may change (or step up) in a stepwise manner at regular intervals according to binary data. In binary current-addition module 120, resistive elements are connected in parallel in such a manner that the resistance of a resistive element is half that of the preceding one, starting with a reference resistance, enabling binary current-addition module 120 to increase current as binary data is counted up. Therefore, when binary data is input to the gates of gate transistors S<0> to S<3>, thereby performing selection control, this enables voltage Vmon to be stepped up.

Thermometer code is data code whereby the number of "1" bits in a binary representation is used as a number represented. For example, when "0," "1," "2," "3," "4,", "5," "6," "7" in decimal are represented as binary data, they are represented using three bits as follows: "000," "001," "010," "011," "100," "101," "111" in that order. When these are represented in thermometer code, they are represented using seven bits as follows: "0000000," "0000001," "0000011," "0000111," "0001111," "0011111," "0111111," "1111111" in that order. Thermometer code current-addition module 121 is controlled using the thermometer code.

Binary code is used for lower bits not required to have so high accuracy (or less influenced even if resistance varies). Thermometer code is used for higher bits required to have high accuracy (or liable to be affected by a variation in resistance). This increases resistance to a variation in resistance.

As described above, a current-addition digital-to-analog converter with a combination of binary code and thermometer code may be used without requiring a pair of differential amplifiers. Then, binary code is used for lower bits in voltage setting data composed of a plurality of bits. Thermometer code is used for higher bits. Then, a method of adding the resistances of the corresponding resistive elements is caused to correspond to binary code control and thermometer code control. This enables the contribution of a variation in the resistance of each of the resistive elements to be minimized when the most significant bit (MSB) is changed.

Such a current-addition digital-to-analog conversion circuit using binary code and thermometer code has been written in U.S. Pat. No. 7,595,684 (application Ser. No. 11/685,382, Jpn. Pat. Appln. KOKAI Publication No. 2007-282473) which is incorporated herein by reference. Such a circuit can be used.

[Modifications]

As described above, the voltage generator 50 according to the embodiments includes a step-up circuit (CP60 in FIG. 6) and a limiter circuit (limiter 70 in FIG. 6). The step-up circuit (CP60 in FIG. 6) outputs a first voltage (VCP in FIG. 6) to a first node (CP_OUT in FIG. 6). The limiter circuit (limiter 70 in FIG. 6) monitors the voltage at the first node, thereby controlling the step-up circuit. The limiter circuit (limiter 70 in FIG. 6) includes a first resistive element (R72 in FIG. 6), a second resistive element (R73 in FIG. 6), a first capacitive element (C74 in FIG. 6), a second capacitive element (C75 in FIG. 6), a switch element (Tr76 in FIG. 6), and a comparator (CMP71 in FIG. 6). The first resistive element (R72 in FIG. 6) has one end connected to the first node (CP_OUT in FIG. 6) and the other end connected to a second node (MON in FIG. 6). The second resistive element (R73 in FIG. 6) has one end connected to the second node (MON in FIG. 6). The first capacitive element (C74 in FIG. 6) has one electrode connected to the first node (CP_OUT in FIG. 6) and the other electrode connected to the second node (MON in FIG. 6). At the same time that the first node (CP_OUT in FIG. 6) is connected to a load (WL in FIG. 6), the switch element (Tr76 in FIG. 6) connects the second capacitive element (C75 in FIG. 6) to the second node (MON in FIG. 6). The comparator (CMP71 in FIG. 6) compares the potential at the second node (MON in FIG. 6) with the reference potential (Vref in FIG. 6) to control the step-up circuit according to the comparison result.

Alternatively, the capacitive element (C74 in FIG. 13) is provided between the first node (CP_OUT in FIG. 13) and the second node (MON in FIG. 13). Then, at the same time that the first node (CP_OUT in FIG. 13) is connected to a load (WL in FIG. 13), the switch element (Tr78 in FIG. 13) disconnects the capacitive element (C74 in FIG. 13) from the first node (CP_OUT in FIG. 13) or the second node (MON in FIG. 13).

As described above, when output node CP_OUT of voltage generation module 50 is connected to a load (word line WL), load 75 is connected temporarily to detection node MON of the limiter circuit 70. Alternatively, bypass capacitor 74 added to improve the stability and response of a stepped-up potential is disconnected by switch 78. During the period excluding the time that a stable operation is expected, load 75 is disconnected from detection node MON and bypass capacitor 74 is connected to output node CP_OUT. This makes it possible to suppress a rapid drop in the potential of detection node MON to a negative value, while securing the stability and response of the stepped-up potential.

As switches 76 and 78, an n-channel MOS transistor and a p-channel MOS transistor can be used. It is conceivable that these MOS transistors do not function sufficiently as switches, depending on the potential of the MON node. Therefore, it is preferable to use transfer gates as switches 76 and 78. This enables at least either the n-channel MOS transistor or p-channel MOS transistor to function as a switch, even if the potential of MON node is zero or VDD (positive potential).

Embodiments are not limited to what has been explained above and may be modified variously. For example, in the described embodiments, the period during which signal CONNECTC is kept high is 0.8 µs, this is illustrative only. Charge sharing between the capacitance on the memory cell array side and the capacitance of the limiter circuit 70 takes place instantaneously. It is sufficient if signal CONNECTC is kept high only when the charge sharing is taking place. In the above embodiments, signal CONNECTC is made high at the same time that node CP_OUT is connected to a word line WL. However, they need not necessarily take place accurately at the same time. Signal CONNECTC may be made high earlier than node CP_OUT is connected to a word line WL. In other words, the expression "at the same time" in this specification allows a certain amount of error.

When signal CONNECTC is made high, capacitive element 75 has an effect on the operation of limiter circuit 70. Therefore, when signal CONNECTC is made high before node CP_OUT is connected to a word line WL, it is preferable to set the timing in a range that prevents capacitive element 75 from having an adverse effect on the operation of limiter circuit 70. The same holds true for the timing with which signal CONNECTC is changed from high to low.

In FIG. 13 explained in the second embodiment, transistor 78 may be provided between capacitive element 74 and node MON. In this case, a low-withstand-voltage transistor may be used as transistor 78. That is, the withstand voltage of transistor 78 (78-1 and 79-2) is, for example, lower than that of transistor 40. Conversely, transistors 78-1 and 78-2 may be provided between capacitive element 74 and node CP_OUT in FIG. 14. In this case, high-withstand-voltage transistors are used as transistors 78-1 and 78-2. That is, the withstand voltage of transistor 78 (78-1 and 78-2) is set to, for example, that of transistor 40 or higher.

Figure 18:
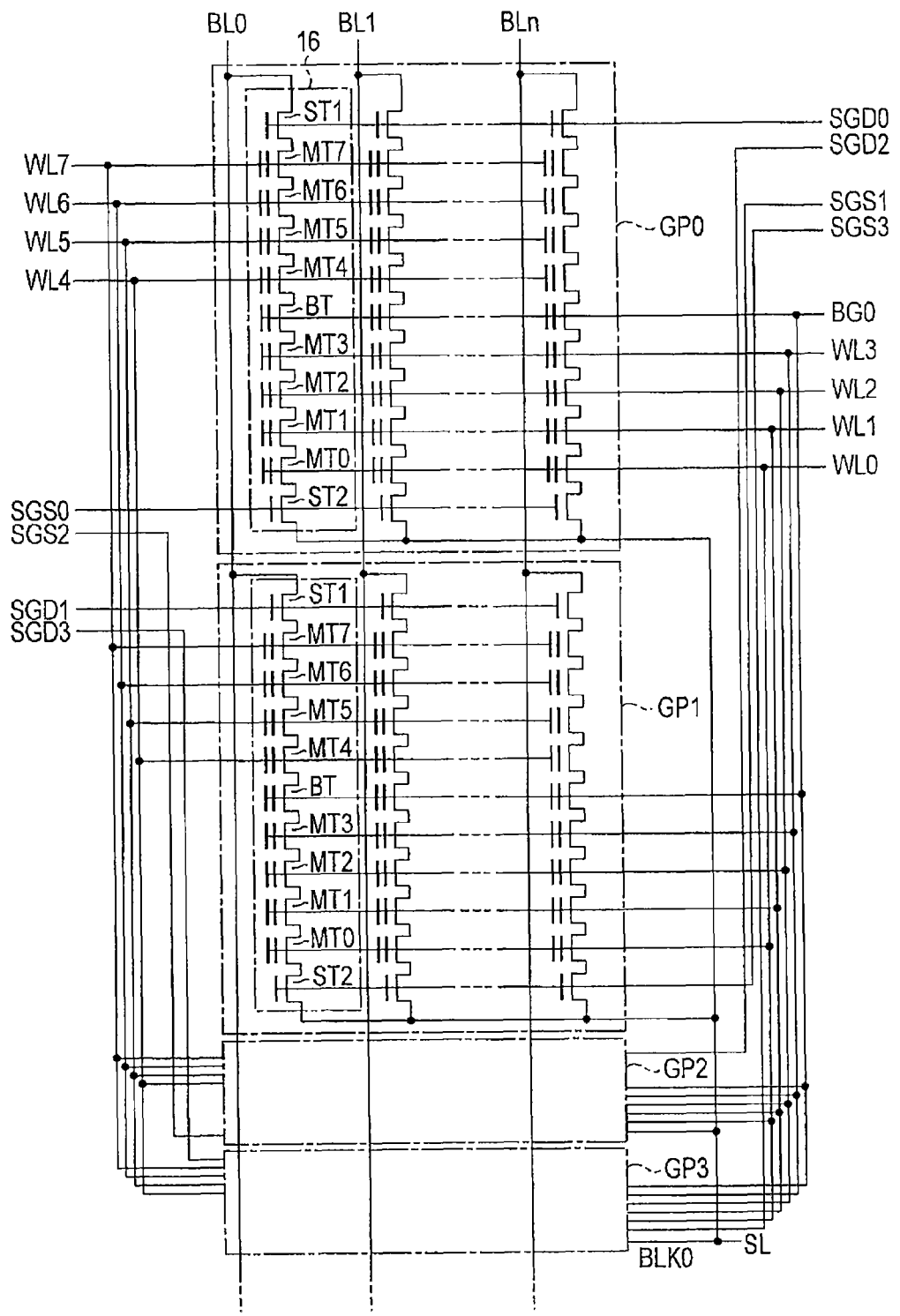
FIG. 18 is a circuit diagram of a memory cell array according to a modification of each of the first to fourth embodiments.

Memory cell array of FIG. 2 may be configured as shown in FIG. 18. FIG. 18 is a circuit diagram of block BLK0. The remaining blocks BLK1 to BLK3 may have the same configuration. As shown in FIG. 18, word lines WL0 to WL3, back-gate line BG, even-numbered select gate lines SGD0 and SGD2, and odd-numbered select gate lines SGS1 and SGS3 are drawn to one side of memory cell array 10. In contrast, word lines WL4 to WL7, even-numbered select gate lines SGS0 and SGS2, and odd-numbered select gate lines SGD1 and SGD3 are drawn to the other side of the memory cell array, that is, to the opposite side of the one side. In this configuration, for example, row decoder 11 may be divided into two sub-row decoders. The sub-row decoders may be arranged so as to sandwich memory cell array 10 between them. One sub-row decoder may select select gate lines SGD0, SGD2, SGS1 and SGS3, word lines WL0 to WL3, and back-gate line BG and the other sub-row decoder may select select gate lines SGS0, SGS2, SGD1 and SGD3, and word lines WL4 to WL7. With this configuration, the congestion of interconnections, including the select gate lines and word lines, between the row decoder 17 and memory cell array 10 can be alleviated.

Furthermore, in the embodiments, a semiconductor memory device has been explained, taking a three-dimensional stacked NAND flash memory as an example. However, the three-dimensional stacked NAND flash memory is not restricted to the configurations shown in FIGS. 3 to 5. For example, semiconductor layer 26 may be of a single columnar shape instead of a horseshoe shape. In this case, transistor BT is unnecessary. The embodiments are not limited to the three-dimensional stack structure and may be applied to a conventional NAND flash memory or the like where memory cells are arranged two-dimensionally in a plane of a semiconductor substrate. However, the memory cell array of the three-dimensional stacked NAND flash memory has a very large capacity as compared with the conventional equivalent. Therefore, when the embodiments are applied the three-dimensional stack structure, their effects are remarkable. Especially, with a configuration where high-density implementation is performed, the reference voltage Vref tends to be made much lower, making Vmon more liable to take a negative value. Therefore, it is preferable to apply the above embodiments to such a configuration.

Of course, the above embodiments can be applied not only to a NAND flash memory but also memory devices with a step-up circuit in general. Moreover, the embodiments may be applied to not only memory devices but also voltage regulators in general.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A voltage generator comprising:
   a step-up circuit which outputs a first voltage to a first node; and
   a limiter circuit which monitors a voltage at the first node and controls the step-up circuit,
   wherein the limiter circuit includes:
      a first resistive element which has one end connected to the first node and other end connected to a second node,
      a second resistive element which has one end connected to the second node,
      a first capacitive element which has one electrode connected to the first node and other electrode connected to the second node,
      a second capacitive element,
      a first switch element which connects the second capacitive element to the second node at the same time that the first node is connected to a load, and
      a comparator which compares the potential at the second node with a reference potential and controls the step-up circuit according to the comparison result.

2. The generator according to claim 1, further comprising a second switch element,
   wherein the second capacitive element includes one electrode connected to the second node via the first switch element and other electrode, and the second switch element connects the one electrode of the second capacitive element to a first potential node at the same time that the first node is disconnected to the load.

3. The generator according to claim 2, wherein 0 V or higher voltage is applied to the first potential node.

4. The generator according to claim 2, wherein the first switch element is a first MOS transistor, and the second switch element is a second MOS transistor, and
a first signal is input to a gate of the first MOS transistor, and an inverted version of the first signal is input to a gate of the second MOS transistor.

5. The generator according to claim 1, wherein the first switch element includes a MOS transistor, and
a withstand voltage of the MOS transistor is lower than that of a MOS transistor which connects the first node to the load.

6. The generator according to claim 1, wherein the first switch element is a transfer gate which includes an n-channel MOS transistor and a p-channel MOS transistor.

7. The generator according to claim 1, wherein the second resistive element includes a current-addition R-2R digital-to-analog converter or a current-addition digital-to-analog converter using binary code and thermometer code, and
a resistance of the second resistive element is variable.

8. The generator according to claim 1, wherein a potential of the first node drops from a first voltage value to a second voltage value at the same time that the first node is connected to the load, and
the first switch element disconnects the second capacitive element from the first node before the potential of the first node returns to the first voltage value.

9. A voltage generator comprising:
a step-up circuit which outputs a first voltage to a first node; and
a limiter circuit which monitors a voltage at the first node and controls the step-up circuit,
wherein the limiter circuit includes
a first resistive element which has one end connected to the first node and the other end connected to a second node,
a second resistive element which has one end connected to the second node,
a capacitive element which is provided between the first node and the second node,
a switch element which disconnects the capacitive element from the first node or the second node at the same time that the first node is connected to a load, and
a comparator which compares a potential at the second node with a reference potential and controls the step-up circuit according to the comparison result.

10. The generator according to claim 9, wherein the switch element includes a MOS transistor including a current path connected between the first node and the capacitive element, and
a withstand voltage of the MOS transistor is equal to or higher than that of a MOS transistor which connects the first node to the load.

11. The generator according to claim 9, wherein the switch element includes a MOS transistor including a current path connected between the second node and the capacitive element, and
a withstand voltage of the MOS transistor is lower than that of a MOS transistor which connects the first node to the load.

12. The generator according to claim 9, wherein the switch element is a transfer gate which includes an n-channel MOS transistor and a p-channel MOS transistor.

13. The generator according to claim 9, wherein the second resistive element includes a current-addition R-2R digital-to-analog converter or a current-addition digital-to-analog converter using binary code and thermometer code, and
a resistance of the second resistive element is variable.

14. The generator according to claim 9, wherein a potential of the first node drops from a first voltage value to a second voltage at the same time that the first node is connected to the load, and
the switch element connects the capacitive element to the first node before the potential of the first node returns to the first voltage value.

15. A semiconductor memory device comprising:
a plurality of memory cells each of which has a stacked gate including a charge accumulation layer and a control gate and whose current paths are connected in series and which are stacked above a semiconductor substrate;
word lines connected to the control gates;
the voltage generator recited in claim 1; and
row decoders which connect the first node of the voltage generator to the word lines.

16. A semiconductor memory device comprising:
a plurality of memory cells each of which has a stacked gate including a charge accumulation layer and a control gate and whose current paths are connected in series and which are stacked above a semiconductor substrate;
word lines connected to the control gates;
the voltage generator recited in claim 9; and
row decoders which connect the first node of the voltage generator to the word lines.

* * * * *